United States Patent
Lee et al.

(10) Patent No.: US 7,537,942 B2
(45) Date of Patent: May 26, 2009

(54) COUNTING CIRCUIT FOR CONTROLLING AN OFF-CHIP DRIVER AND METHOD OF CHANGING AND OUTPUT CURRENT VALUE OF THE OFF-CHIP DRIVER USING THE SAME

(75) Inventors: Kang Youl Lee, Cheongju-Si (KR); Jun Hyun Chun, Cheongju-Si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/685,870

(22) Filed: Mar. 14, 2007

(65) Prior Publication Data

US 2007/0165768 A1    Jul. 19, 2007

Related U.S. Application Data

(62) Division of application No. 11/160,271, filed on Jun. 16, 2005, now Pat. No. 7,302,029.

(30) Foreign Application Priority Data

Dec. 30, 2004    (KR)   ............... 2004-117347

(51) Int. Cl.
     *H01L 21/66*    (2006.01)
(52) U.S. Cl. ........................................ 438/14
(58) Field of Classification Search ............. 438/10–16; 324/760–775
See application file for complete search history.

(56) References Cited

U.S. PATENT DOCUMENTS

| 5,426,375 A | * | 6/1995 | Roy et al. | ............... 324/769 |
| 6,696,849 B2 | * | 2/2004 | Ban et al. | ............... 324/760 |
| 6,764,867 B1 | * | 7/2004 | Stephens et al. | ............... 438/14 |

FOREIGN PATENT DOCUMENTS

| JP | 2001-210092 | 8/2001 |
| JP | 2002-150788 | 5/2002 |
| KR | 2002-0058525 | 7/2002 |
| KR | 2003-008931 | 11/2003 |

* cited by examiner

*Primary Examiner*—Charles D. Garber
*Assistant Examiner*—Andre' C Stevenson
(74) *Attorney, Agent, or Firm*—Marshall, Gerstein & Borun LLP

(57) ABSTRACT

Provided is a method of changing an output current value of an off-chip driver by means of a counting circuit including pluralities of fuses for controlling the off-chip driver, that includes measuring the output current value of the off-chip driver after completing a wafer test; cutting the fuses of the counting circuit off when the measured output current value is smaller than a target value, increasing the initial value of a off-chip driving control signal; and fabricating a package when the measured output current value is equal to a target value.

2 Claims, 4 Drawing Sheets

COUNTING CIRCUIT FOR CONTROLLING AN OFF-CHIP DRIVER AND METHOD OF CHANGING AND OUTPUT CURRENT VALUE OF THE OFF-CHIP DRIVER USING THE SAME

CROSS-REFERENCE TO RELATED APPLICATIONS

This patent is a divisional of U.S. Ser. No. 11/160,271, filed Jun. 16, 2005, which claims priority to KR 2004-117347 filed Dec. 30, 2004, the disclosures of which are hereby expressly incorporated herein for all purposes.

FIELD OF THE INVENTION

The present invention relates to a semiconductor memory device and specifically, to a counting circuit for controlling an off-chip driver and method of changing a DC (or AC) output current value of the off-chip driver using the same.

DISCUSSION OF RELATED ART

An off-chip driver called as an output driver is a circuit driving an output node in a predetermined output voltage level so as to transfer data from the semiconductor chip to the external system.

FIG. 1 illustrates a conventional counting circuit for controlling an off-chip driver.

Referring to FIG. 1, the counting circuit for controlling the off-chip driver includes SR latch circuits 101 to 115, AND gates 121 to 135, NOR gates 141 to 155, and OR gates 161 to 175.

The SR latch circuits 101 to 115 each output a high level signal in response to a set input S and each output a low level signal in response to a reset input R to generate an off-chip driving control signal OCD<0:14>.

The AND gates 121 to 123 generate logical products from an increment signals INC and the previous output signals of the SR latch circuits. The NOR gates 141 to 143 performs non-disjunction of an inverse signal of a decrement signal DEC and the next output signals of the SR latch circuits, outputting the summed results to the reset input terminals R of the SR latch circuits 101 to 103. The OR gates 161 to 163 logically sums an initializing signal RST and output signals of the AND gates 121 to 123, to output the summed results to the set input terminals S of the SR latch circuits 101 to 103. The AND gates 134 and 135 generate logical products from the increment signal INC and the previous output signals of the SR latch circuits to output the product results to the set input terminals S of the SR latch circuits 114 and 115. The NOR gates 154 and 155 logically sums the inverse signal of the decrement signal DEC and the next output signals of the SR latch circuits. The OR gates 174 and 175 logically sums the initializing signal RST and output signals of the NOR gates 154 and 155 to output the summed results to the reset input terminals R of the SR latch circuits 114 and 115.

As aforementioned, the initializing signal RST is applied to the set input terminals S through the OR gates 161 to 163 in the SR latch circuits 101 to 103, while applied to the reset input terminals R through the OR gates 174 and 175 in the SR latch circuits 114 and 115. Thus, the SR latch circuits 101 to 115 are set on '000 . . . 11' as an initial value of the off-chip driving control signal OCD<1:14> when the initializing signal RST is introduced thereto from the external. During this, the incrementing and decrement signals, INC and DEC, are disabled when the initializing signal RST is input thereto. In other words, the incrementing and decrement signals, INC and DEC, become inactive when the SR latch circuits are being initialized.

In general, a DC output current value of the off-chip driver is always variable along fluctuation of PMOS and NMOS processing characteristics, not conditioned with a regulated current value on PMOS and NMOS pattern. However, as the conventional counting circuit for the off-chip driver has a fixed initial value thereof, which is constant nevertheless of variation in PMOS and NMOS processing characteristics. As a result, a DC output current value of the off-chip driver may be variable in accordance with variation of PMOS and NMOS processing characteristics, altering output timings thereof.

Furthermore, it is troublesome to reproduce the off-chip driver proper to the DC output current value by modifying mask patterns in order to correspond with the variation.

SUMMARY OF THE INVENTION

The present invention is directed to solve the problem, providing a counting circuit for controlling an off-chip driver and method of changing a DC output current value of the off-chip driver using the same in accordance with variations of processing characteristics with PMOS and NMOS in the state of wafer level.

An aspect the present invention is to provide a counting circuit for controlling the off-chip driver, including: pluralities of counting means generating pluralities of off-chip driving control signals; pluralities of fuse blocks generating set and reset input signals to vary initial values of the off-chip driving control signals; and pluralities of initial value modifying circuit varying the initial values of the off-chip driving control signals in response to the set and reset input signals.

In this embodiment, the fuse blocks determine logical levels of the set and reset input signals in accordance with cutting states of the fuses. The fuse blocks output the set and reset input signals of high and low levels, respectively, when the fuses are cut off, while output the set and reset input signals of low and high levels, respectively, when the fuses maintains being connected. If the fuses are cut off, the counting circuits receive the set input signals of high levels through set input terminals and the reset input signals of low levels through reset input terminals, and changes the initial value of the off-chip driving control signal into high level; and wherein if the fuses maintains being connected, the counting circuits receive the set input signals of low levels through set input terminals and the reset input signals of high levels through reset input terminals, and changes the initial value of the off-chip driving control signal into low level.

In this embodiment, the fuse block operates in a normal operation when the initializing signal is input with low level, while operates in an initializing operation when the initializing signal is input with high level. The fuse block comprises: a fuse connected to a first power source voltage through one terminal and connected to a first node through the other terminal; a resistor connected to the first node through one terminal and connected to a second power source voltage through the other terminal; a first logical element logically combining an inverse signal of the initializing signal and a signal of the first node and then outputting an output to the set input terminals of the latch circuits; and a second logical element logically combining the initializing signal and the signal of the first node and then outputting an output to the reset input terminals of the latch circuits. In this embodiment, the resistor is larger by five times than the fuse in resistance. The first node goes to low level when the fuse is cut off, while goes to high level when the fuse maintains being connected.

In this embodiment, the initial value modifying circuit comprises: a first logical element logically combining the set input signal and a first signal that is disabled during an initializing operation, and outputting an output signal to set input terminals of the latch circuits; and a second logical element logically combining the reset input signal and a second signal that is disabled during an initializing operation, and outputting an output signal to reset input terminals of the latch circuits.

Another aspect of the invention is a method of changing an output current value of an off-chip driver by means of a counting circuit including pluralities of fuses for controlling the off-chip driver, comprising the steps of: measuring the output current value of the off-chip driver after completing a wafer test; cutting the fuses of the counting circuit off when the measured output current value is smaller than a target value, increasing the initial value of a off-chip driving control signal; and fabricating a package when the measured output current value is equal to a target value.

In the method, it further comprises the step of maintaining the fuses connected when the measured output current value is larger than a target value, decreasing the initial value of an off-chip driving control signal.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numerals refer to like elements throughout the specification.

Figure 2:
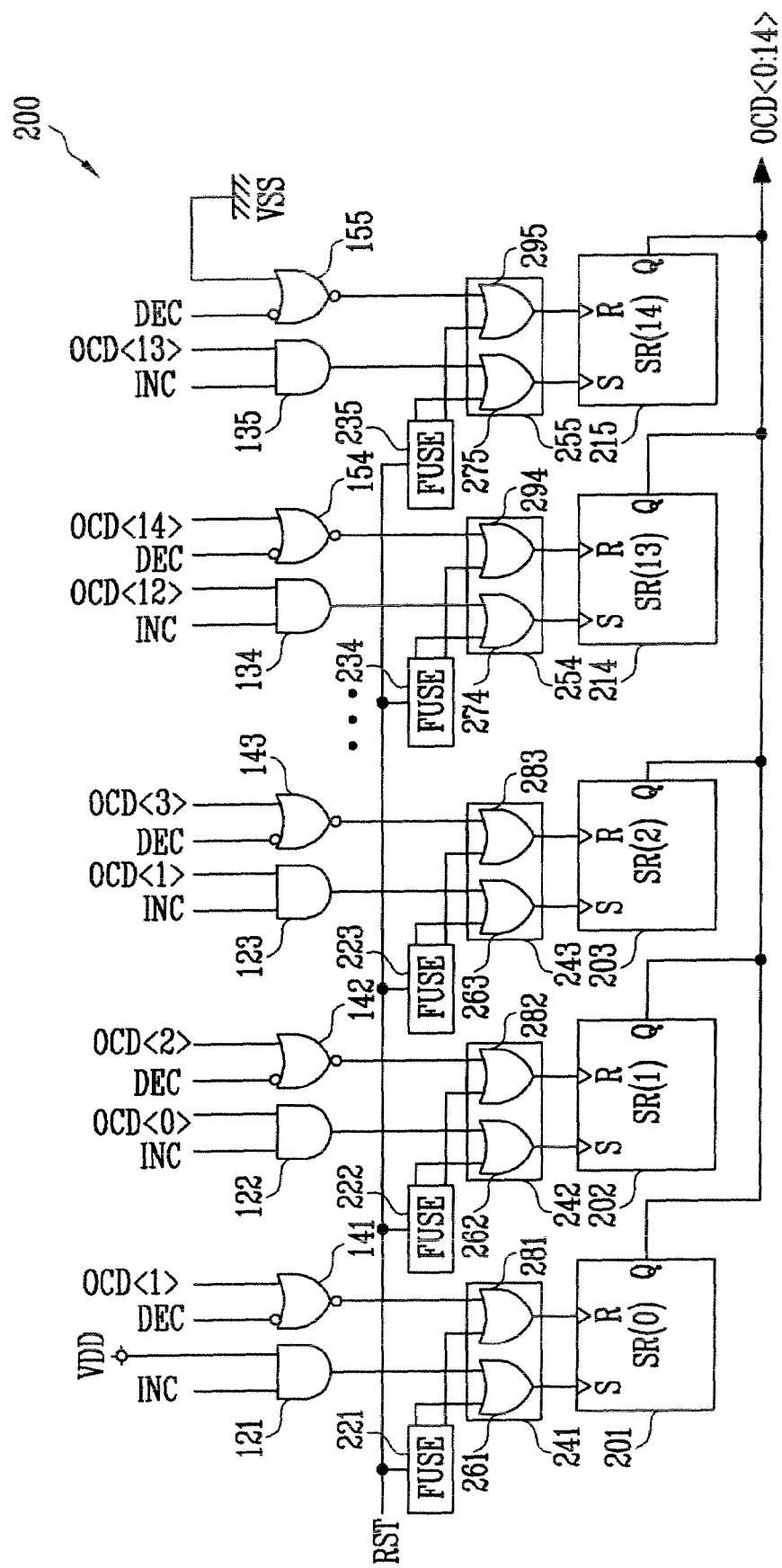
FIG. 2 is a circuit diagram illustrating a conventional counting circuit for controlling an off-chip driver according to a preferred embodiment of the present invention.

FIG. 2 is a circuit diagram illustrating a conventional counting circuit for controlling an off-chip driver according to a preferred embodiment of the present invention.

Referring to FIG. 2, the counting circuit for controlling an off-chip driver 200, according to the present invention, is comprised of SR latch circuits 210 to 215, fuse blocks 221 to 225, initial value changing circuits 241 to 255, AND gates 121 to 135, and NOR gates 141 to 155.

Figure 1:
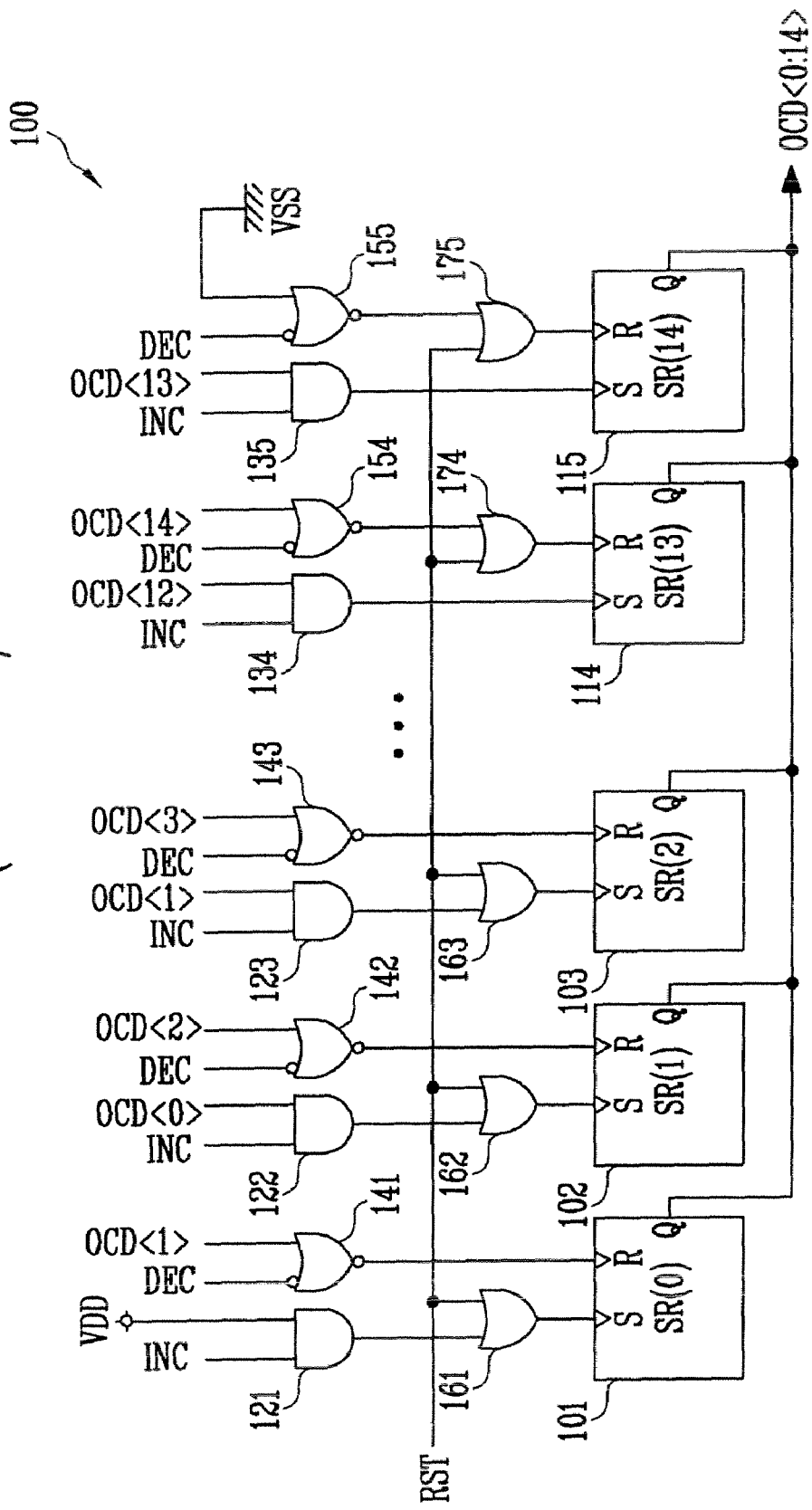
FIG. 1 is a circuit diagram of a conventional counting circuit for controlling an off-chip driver.

Here, reference numerals disclosed in FIG. 2, which are identical to those of FIG. 1, correspond to the same elements with those of FIG. 1, so will be easily understood about the structures and functions by referring the description relevant to FIG. 1.

The SR latch circuits 201 to 215 each output a high level signal in response to a set input terminal S and each output a low level signal in response to a reset input terminal R, generating an off-chip driving control signal OCD<0:14>.

The fuse blocks 221 to 225 output reset input signals RT of logical low level and set input signals ST of logical high level when fuses are cut off, while output reset input signals RT of logical high level and set input signals ST of logical low level when fuses are connected thereon. The set and reset input signals, ST and RT, are each applied to the set and reset input terminals S and R, altering an initial value of the off-chip driving control signal OCD<0:14>.

The initial value changing circuits 241 to 255 alter the initial value of the off-chip driving control signal OCD<0:14> by using the set and reset input signals ST and RT. Each of the initial value changing circuit 241 to 255 is composed of OR gates 261 to 275 and OR gates 281 to 295.

The OR gates 261 to 275 logically sums output signals of the AND gates 121 to 135 and the set input signals ST of the fuse blocks 221 to 235, outputting the summed results to the set input terminals S of the SR latch circuits 201 to 215. The OR gates 281 to 295 logically sums output signals of the NOR gates 141 to 155 and the reset input signals RT of the fuse blocks 221 to 235, outputting the summed results to the reset input terminals R of the SR latch circuits 201 to 215.

Figure 3:
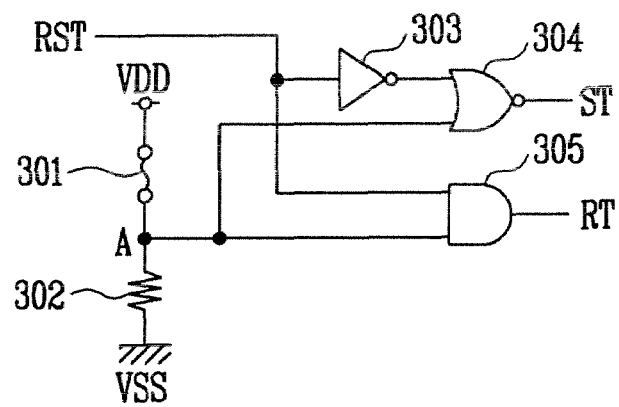
FIG. 3 is a circuit diagram illustrating the fuse block shown in FIG. 2.

FIG. 3 is a circuit diagram illustrating the fuse block shown in FIG. 2. Each of the fuse blocks 221 to 225 is comprised of a fuse 301, a resistor 302, an inverter 303, a NOR gate 304, and an AND gate 305.

The fuse 301 is connected to a power source voltage VDD through one terminal and connected to a node A through the other terminal. The resistor 302 is connected to the node A through one terminal and connected to a ground voltage VSS through the other terminal. The inverter 303 converts the initializing signal RST to its inverse signal. The NOR gate 304 inversed-logicaly sums an output signal of the inverter 303 and a signal of the node A, and then outputs the set input signal ST. The set input signal ST is applied to the set input terminal S of the SR latch circuit. The AND gate 305 generates a logical product from the initializing signal RST and the signal of the node A, and then outputs the reset input signal RT. The reset input signal RT is applied to the reset input terminal R of the SR latch circuit.

Now, it will be described about an operation of the fuse block shown in FIG. 3.

Here, the resistor 302 is designed to be larger by five times than the fuse 301 in resistance. Thus, if the fuse 301 is cut off, the node A goes to the ground voltage VSS that is low level. If the fuse 301 is not cut off, the node A goes to the power source voltage VCC that is high level.

First, if the initializing signal RST becomes low level, it is regarded as being a normal operation such that the set and reset input signals ST and RT are applied each to the set and reset input terminals S and R of the SR latch circuit in low levels, and the increment and decrement signals INC and DEC are enabled to make the counting circuit 200 conduct a normal counting operation.

Continuously, if the initializing signal RST becomes high level, it is regarded as being an initializing operation, by which one of the set and reset input signals, ST and RT, applied each to the set and reset input terminals S and R of the SR latch circuit goes to high level to initialize the off-chip driving control signal OCD<0:14> of the SR latch circuits 201 to 205. During this, the increment and decrement signals, INC and DEC, are being disabled.

If a fuse of the fuse block 221 coupled to the SR latch circuit 201 is not cut off when the initializing signal RST is set on high level, the set and reset input signals ST and RT go to low and high levels respectively to make the initial value of the off-chip driving control signal OCD<0> of the SR latch circuit 201 be low level. Otherwise, if a fuse of the fuse block 221 coupled to the SR latch circuit 201 is cut off, the set and reset input signals ST and RT go to high and low levels respectively to make the initial value of the off-chip driving control signal OCD<0> of the SR latch circuit 201 be high level.

Hereinafter, with reference to FIGS. 2 and 3, it will be described about an operation of the counting circuit 200 for controlling the off-chip driver in accordance with the present invention.

If the fuses 301 of the SR latch circuit 201 to 203 are cut off, the set input terminals S receive the set input signals of high levels to set the initial value of the off-chip driving control signal OCD<1:2> on high levels. If the fuses 301 of the SR latch circuit 201 to 203 are not cut off, the SR latch circuits 214 and 215 receive the set input signals of low levels through the set input terminals S and then set the initial value of the off-chip driving control signal OCD<1:2> on low levels. Thus, the SR latch circuits 201 to 215 are established with their initial values of '111 . . . 00'.

After then, along the proceedings of processing course, it there is variation in current drivability of the PMOS and NMOS elements, a DC output current value from the off-chip driver is varied the variation.

Exemplary, under the condition that the initial value of the off-chip driving control signal OCD<0:14> generated from the SR latch circuits 201 to 215 is set on '00000001111111', if a DC output current value of the off-chip driver is smaller than a target value, four fuses are further cut off in the fuse blocks 221 to 225 so as to change four '0's into all '1'. Then, the four '1's are added to the initial value of the off-chip driving control signal OCD<0:14>, increasing the initial value of the off-chip driving control signal OCD<0:14>. By this operation, it obtains a DC output current value of the off-chip driver in a required level.

While the conventional counting circuit for controlling the off-chip driver has a fixed initial value thereof, the present invention makes a counting circuit for the off-chip driver available to flexibly establish the initial value of the off-chip driving control signal OCD<1:14> from '00000000000000' to '11111111111111' by adjusting the fuse cutting operation along variation of PMOS and NMOS processing characteristics.

Figure 4:
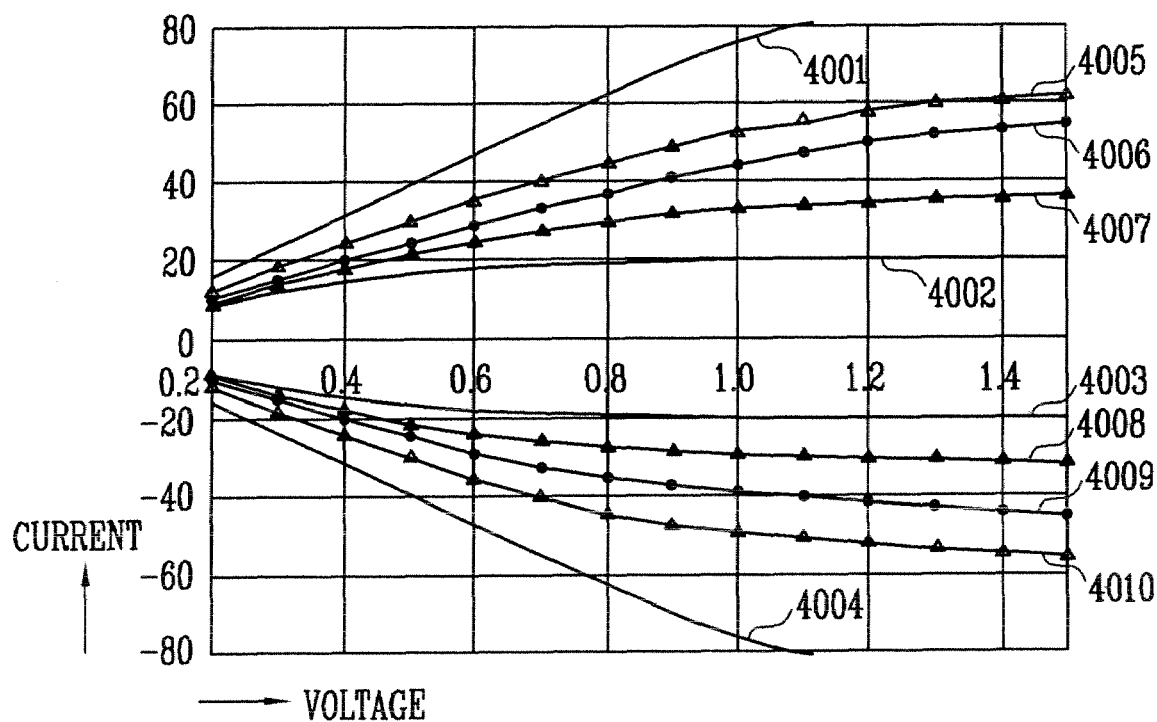
FIG. 4 is a graphic diagram showing variation of a DC output current value by the off-chip driver.

FIG. 4 is a graphic diagram showing variation of a DC output current value by the off-chip driver.

In the graph of FIG. 4, the current values of 0 to 80 mA and −80 to 0 mA marked on the vertical axis represent NMOS and PMOS current values, respectively, of the off-chip driver. The horizontal axis of the graph represents variation of the voltage Vds between drain and source at an output terminal of the off-chip driver.

Referring to FIG. 4, plotting curves 4001 and 4002 denote regulated NMOS current values defined for a standard CMOS memory device, and plotting curves 4003 and 4004 denote regulated PMOS current values defined for a standard CMOS memory device. That is, as a general memory device has regulated NMOS and PMOS current values, a DC output current of the off-chip driver must be confined within the range of the regulated values. Curves 4006 and 409 represent initially established current values of PMOS and NMOS, i.e., target values. Such a target value is established with an intermediated one between the maximum and minimum values defined therein.

Curves 4005 and 4008 represent the states of increasing the DC output current values of the off-chip driver by strengthening the current drivability of NMOS and PMOS. In this case, the number of '0' bits are more added to the initial value of the off-chip driving control signal OCD<0:14> of the SR latch circuits, decreasing the initial value. Thus, the DC output current values 4005 and 4008 of the off-chip driver become to be near their target values 4006 and 4009.

Curves 4007 and 4010 represent the states of decreasing the DC output current values of the off-chip driver by lessening the current drivability of NMOS and PMOS. In this case, the number of '1' bits are more added to the initial value of the off-chip driving control signal OCD<0:14> of the SR latch circuits, increasing the initial value. Thus, the DC output current values 4007 and 4010 of the off-chip driver become to be near their target values 4006 and 4009.

Figure 5:
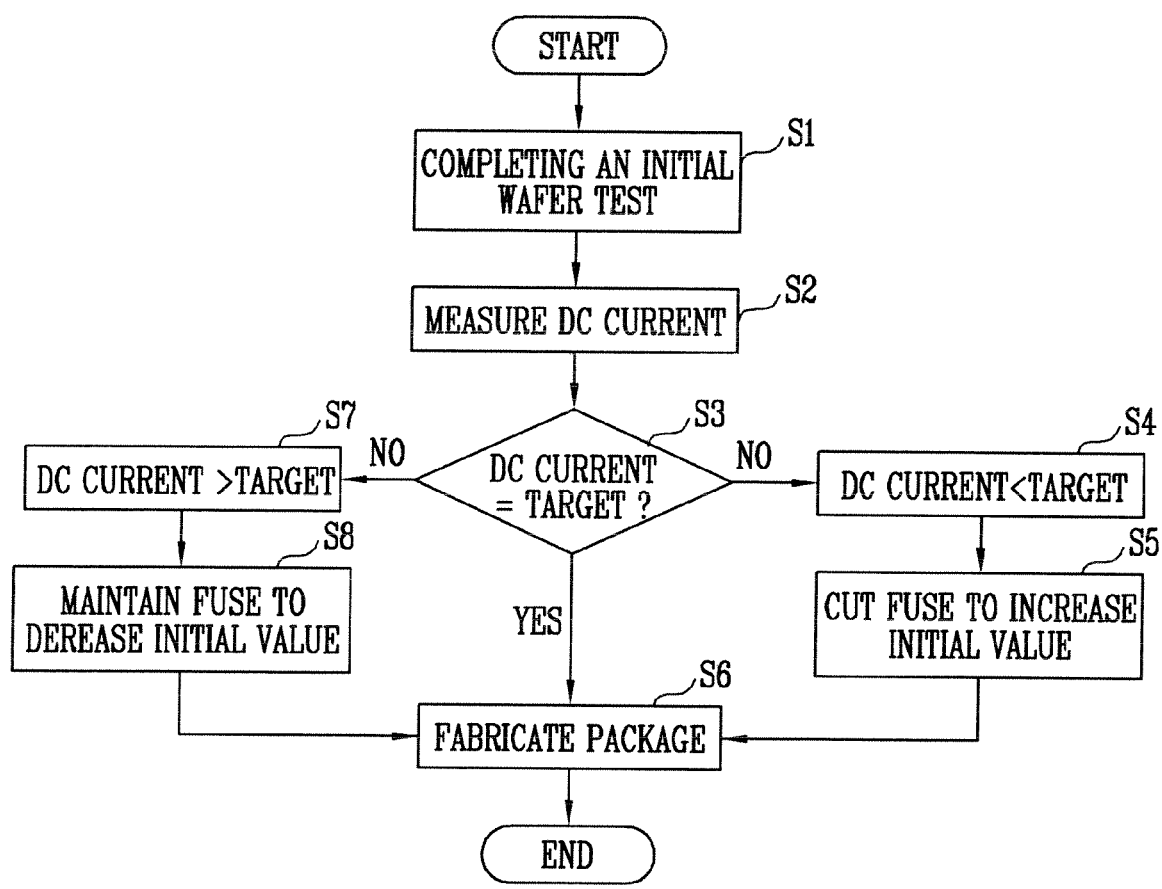
FIG. 5 is a flow chart showing a method of changing the DC output current value of the off-chip driver by means of the counting circuit shown in FIG. 2.

FIG. 5 is a flow chart showing a method of changing the DC output current value of the off-chip driver by means of the counting circuit shown in FIG. 2.

Referring to FIG. 8, after completing an initial wafer test (S1), a DC output current value of the off-chip driver is measured (S2). If the measured DC output current value matches with the target value (S3), it begins directly to fabricate a package with the wafer (S6). If the measured DC output current value smaller than the target value (S4), it begins to fabricate a package (S6) after fitting the measured value to the target value (S5) by increasing the initial value of the off-chip driving control signal OCD<0:14> from cutting the fuses off. If the measured DC output current value larger than the target value (S7), it begins to fabricate a package (S6) after fitting the measured value to the target value (S8) by decreasing the initial value of the off-chip driving control signal OCD<0:14> without cutting the fuses off.

As described above, the present invention provides a counting circuit for controlling an off-chip driver and method of changing a DC output current value of the off-chip driver using the same in accordance with variations of PMOS and NMOS processing characteristics. Moreover, the present invention is able to change a DC (AC) output current value of the off-chip driver in accordance with variations of PMOS and NMOS processing characteristics without modifying circuit configurations.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of changing an output current value of an off-chip driver comprising:

providing a counting circuit including a plurality of SR latch circuits, initial value change circuits and fuse blocks each of which has a fuse;

measuring the output current value of the off-chip driver after completing a wafer test;

selecting fuses to be cut according to the measured output current;

changing outputs of the initial value change circuit corresponding to the selected fuses by cutting the selected fuse to change set input signals of the SR latch circuits corresponding the selected fuses, thereby changing an initial value of an off-chip driver control signal in response to outputs of the SR latch circuits; and fabricating a package after performing the step of changing the outputs of the initial value change circuit.

2. The method as set forth in claim 1, which further comprises the step of maintaining the plurality of fuses connected when the measured output current value is larger than a target value, decreasing the initial value of the off-chip driving control signal.

* * * * *